United States Patent [19]

Moore

[11] Patent Number: 5,275,844
[45] Date of Patent: Jan. 4, 1994

[54] PROCESS FOR FORMING A CRACK-FREE BORON NITRIDE COATING ON A CARBON STRUCTURE

[75] Inventor: Arthur W. Moore, North Olmsted, Ohio

[73] Assignee: Praxair S.T. Technology, Inc., Danbury, Conn.

[21] Appl. No.: 819,647

[22] Filed: Jan. 10, 1992

Related U.S. Application Data

[63] Continuation-in-part of Ser. No. 564,108, Aug. 8, 1990, abandoned.

[30] Foreign Application Priority Data

Aug. 8, 1991 [WO] PCT Int'l Appl. .......... US-91/05505

[51] Int. Cl.$^5$ ............................................... C23C 16/34
[52] U.S. Cl. ............................. 427/255.2; 427/255.1; 427/248.1
[58] Field of Search ................ 427/255.2, 255.1, 248.1

[56] References Cited

U.S. PATENT DOCUMENTS

| | | | |
|---|---|---|---|
| 3,152,006 | 10/1964 | Basche | 428/688 |
| 3,578,403 | 7/1968 | Moore | 23/293 |
| 4,225,569 | 9/1980 | Matsui et al. | 423/445 |
| 4,522,842 | 6/1985 | Levinstein et al. | 427/8 |
| 4,849,146 | 7/1989 | Tanji et al. | 264/81 |
| 4,900,526 | 2/1990 | Matsuda et al. | 423/290 |

Primary Examiner—Michael Lusigan
Assistant Examiner—Roy V. King
Attorney, Agent, or Firm—Eugene Lieberstein

[57] ABSTRACT

A process for producing a crack-free coating of pyrolytic boron nitride on a carbon structure in which the coating is formed in a controlled atmosphere containing vapors of ammonia and gaseous boron halide within a temperature range of between 1500° C. to 1700° C.

5 Claims, 2 Drawing Sheets

PROCESS FOR FORMING A CRACK-FREE BORON NITRIDE COATING ON A CARBON STRUCTURE

This application is a continuation-in-part of prior U.S. patent application Ser. No. 07/564,108, filed Aug. 8, 1990, now abandoned.

FIELD OF INVENTION

The present invention specifically relates to an improved process for forming a coating of boron nitride on a carbon-carbon composite to provide oxidation protection at high temperature and to the article formed by the process.

BACKGROUND OF INVENTION

Carbon-carbon composites are important materials for aerospace applications because they retain high strength and toughness at high temperature. However, the use of carbon-carbon composite material is presently limited because of its susceptibility to oxidation. Oxidation protection may be provided by depositing a protective layer on the surface of the carbon-carbon composite which is resistant to oxidation. A preferred material is boron nitride.

Heretofore all attempts to form a boron nitride coating by chemical vapor deposition resulted in a coating having a thermal expansion substantially higher than the thermal expansion of the carbon-carbon composite substrate. A conventionally deposited pyrolytic boron nitride coating has a thermal expansion on the order of three times the thermal expansion of a typical carbon-carbon composite material. The mismatch in thermal expansion causes cracks to form in the boron nitride coating when cycled from deposition temperature to room temperature.

The method of the present invention produces a "crack-free" pyrolytic boron nitride coating over a carbon-carbon composite structure to provide oxidation protection for the composite structure at temperatures of up to 800° C. and higher. For purposes of the present invention "crack-free" means a coating essentially free of cross-plane cracks which would allow air to penetrate to the carbon-carbon composite. The presence of cracks parallel to the deposition surface are not as serious provided they are not accompanied by such cross-plane cracks. Accordingly, as long as there are essentially no cracks which penetrate in a direction transverse to the deposition surface, the coating is considered "crack-free".

SUMMARY OF THE INVENTION

The process of the present invention for producing a crack-free coating of pyrolytic boron nitride on a carbon-carbon composite structure comprises contacting said carbon-carbon composite structure with vapors of ammonia and gaseous boron halide in a controlled atmosphere containing such vapors and maintaining such atmosphere within a temperature range of between 1500° C. and 1700° C.

BRIEF DESCRIPTION OF THE DRAWINGS

The advantages of the present invention will become apparent from the following detailed description of the invention when read in conjunction with the accompanying drawings of which.

DETAILED DESCRIPTION OF THE INVENTION

Figure 1:
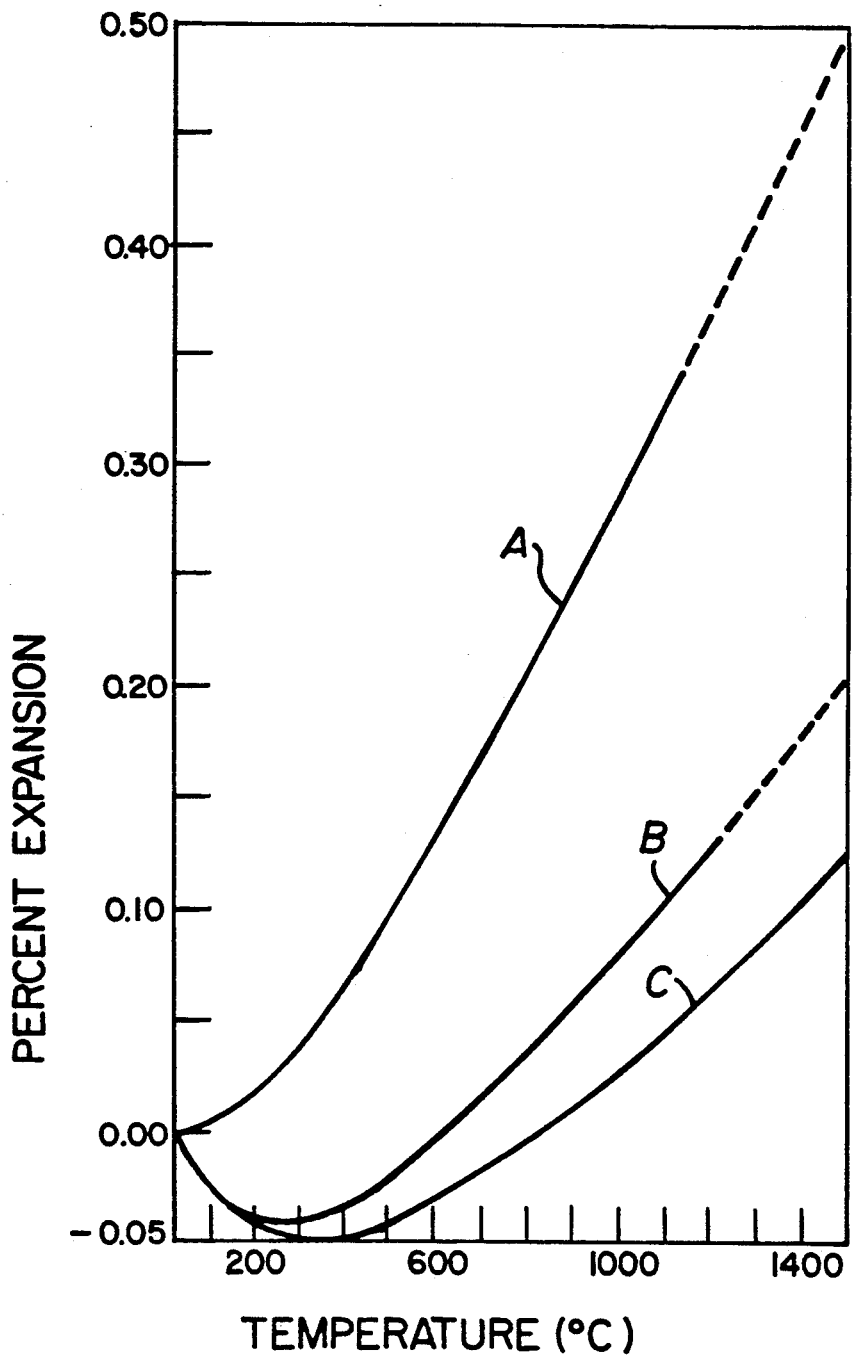
FIG. 1 is a graph comparing the thermal expansion curve of a boron nitride coating deposited on a carbon-carbon composite in accordance with the present invention with both the thermal expansion curve of a commercial pyrolytic boron nitride (PBN) coating and the carbon-carbon substrate upon which the boron nitride coating composite was formed.

A conventional carbon-carbon composite is a material composed of a woven or non-woven fabric of carbon fibers with a carbonaceous material directly bonded to the carbon fibers to form a unitary structure. An example of a carbon-carbon composite is a woven fabric of carbon fibers obtained by carbonizing polyacrylonitrile (PAN) fibers, forming a shaped substrate from the carbon fibers and depositing a pyrolytic material such as pyrolytic carbon on the carbon fibers. The deposition of carbon is typically carried out by introducing a hydrocarbon gas into a furnace containing the carbon fiber substrate under conditions permitting the gas to decompose and carbonize at the surface of the carbon fibers.

This invention relates to a newly discovered process for forming a pyrolytic boron nitride coating on a carbon-carbon composite which exhibits a thermal expansion tailored to match the thermal expansion of the underlying carbon-carbon composite structure. Pyrolytic boron nitride provides oxidation resistance to the underlying structure making it an ideal coating for carbon-carbon composites for use in aerospace applications. However, conventional pyrolytic boron nitride coatings have a thermal expansion of between about 0.4 to 0.5 percent over a temperature range from room temperature to 1500° C. A carbon-carbon composite has a typical thermal expansion of between about 0.13 to 0.17 percent over the same temperature range. Thus a pyrolytic boron nitride coating formed in accordance with conventional practice on a carbon-carbon composite will have a substantially higher thermal expansion relative to the underlying carbon-carbon composite which will cause cracks in the coating during cool down.

The conventional method for forming a pyrolytic boron nitride coating on a free standing structure is described in detail in U.S. Pat. No. 3,152,006, the disclosure of which is herein incorporated by reference. Pyrolytic boron nitride is produced by the thermal decomposition of boron trichloride and ammonia vapors in accordance with the following overall reaction:

$$NH_3 + BCl_3 \rightarrow BN + 3HCl$$

The reactor temperature may be between 1450° C. and 2300° C. with a preferential temperature range of between 1850° C. and 2200° C. The method, as described in the aforementioned patent, is conventionally practiced at a deposition temperature of between 1850° C.-1950° C.

It has been discovered in accordance with the present invention that a pyrolytic boron nitride coating may be formed on a carbon-carbon composite structure with a low thermal expansion of between 0.14 to 0.32 percent over a temperature range between room temperature and 1500° C. thereby closely conforming to the typical thermal expansion of a carbon-carbon composite. To practice the process of the present invention a conventional vacuum furnace may be used as taught and described in U.S. Pat. No. 3,152,006. The process of the present invention, however, requires the deposition temperature to lie in a critical range of between 1500° C.–1700° C. and preferably at about 1650° C. It is totally unexpected that within this critical temperature range a uniform coating of boron nitride will form with a very low thermal expansion in close conformity to the thermal expansion of the underlying carbon-carbon composite. It was also discovered in accordance with the present invention that one can form an enhanced well bonded coating of boron nitride upon a carbon or graphite structure by tailoring the temperature of the atmosphere during the deposition of the boron nitride coating to a temperature of less than 1800° C. to provide a matched thermal expansion between the coating and the carbon or graphite structure.

The graph in FIG. 1 shows the comparative difference between the thermal expansion of a typical pyrolytic boron nitride coating A, formed in accordance with conventional practice and a coating B of pyrolytic boron nitride, formed in accordance with the method of the present invention, over a temperature range of from 0°–1500° C. The thermal expansion curve over the same temperature range for a typical carbon-carbon composite C having high in-plane strength and moderately high Young's modulus, i.e., 10–20 million psi, is also illustrated. The thermal expansion curve for the pyrolytic boron nitride coating B closely matches to the thermal expansion curve of the carbon-carbon composite C with less than 0.1% difference in expansion at 1500° C. This means that the pyrolytic boron nitride coating, which is stress-free at deposition temperature, is subjected to less than 0.1% tensile strain when cooled to room temperature. Because the thermal expansion of the coating nearly matches that of the carbon-carbon composite, good coating-to-substrate adherence is obtained. Furthermore, no special surface preparation is needed for good coating adherence.

The pyrolytic boron nitride coating is formed in accordance with the present invention by mounting the carbon-carbon substrate to be coated in a hot wall deposition chamber, preferably of graphite, which can be electrically heated by resistance or induction inside a vacuum vessel. The carbon-carbon substrate(s) may be fixedly supported or rotationally supported in the deposition chamber. The deposition furnace is evacuated and the deposition chamber is heated to a uniform temperature of between 1500°–1650° C. When the desired temperature is reached, boron trichloride and ammonia, with or without nitrogen dilution, are metered into the deposition chamber to start the growth of pyrolytic boron nitride (PBN). After the coating has reached the desired thickness, as controlled by the reactant gas flow rates, deposition time and other process variables, the run is shut down and the coated carbon-carbon composites are removed. The coating operation may be repeated to fill voids. All of the PBN coatings formed in accordance with the present invention have a hexagonal crystal structure and a density in the range of 1.75–1.90 g/cc.

The following examples are illustrative of the invention:

EXAMPLE 1

Eight carbon-carbon composites were mounted on graphite bars and placed in a pilot-plant size CVD chamber 6.5" diameter by 12" long. This system was placed inside a stainless steel vacuum chamber which was evacuated and then the chamber was heated to 1650° C. Ammonia and $BCl_3$ in the molar ratio 4.0 to 1.0 were fed into the deposition chamber to start the growth of PBN. The reaction was carried out for 270 minutes at 300 microns Hg pressure. After the furnace had cooled, the PBN coated carbon-carbon composites were removed, weighed, and the coating thickness was estimated based on an assumed coating density of 1.80 g/cc based on earlier PBN coatings made under similar deposition conditions. The coated composites from this first run were turned upside down and mounted again in the deposition chamber for a second coating to seal the small areas that were in contact with the graphite support in the first run. The second coating was carried out at 1650° C. and 400 microns Hg for 285 minutes.

The PBN coatings from these two runs were found to be more translucent than coatings made at higher temperatures, and most of the coatings were free of visual cracks. It was determined that the average density of these PBN coatings was about 1.8 g/cc, and the percent expansion parallel to the deposition plane was 0.32% up to 1500° C. Although this expansion is still about 0.15% higher than that of the lowest CTE carbon-carbon composites, other properties of the PBN, such as its lower modulus (and the smaller temperature difference from coating temperature to room temperature compared with coatings made at higher temperatures) are important for yielding crack-free coatings.

EXAMPLE 2

This example is a scale-up of the conditions of Example 1, using a 17-inch diameter by 27-inch long deposition chamber to coat in a single run three pairs of carbon-carbon composite plates each about $12 \times 29$ cm $\times 2$–3 mm. These plates were coated at 1650° C. for 900 minutes, using a pressure of 300 microns and an $NH_3:BCl_3$ ratio of 3.6. The approximate coating thickness was in the range 17–21 mils. The scale-up was successful in that 11 of the 12 coated surfaces were crack-free. The thermal expansion curve for one of the coatings is illustrated as curve B in FIG. 1. The thermal expansion of the PBN coating may have been affected by the thermal expansion of the composite being coated. The composite had a thermal expansion of 0.12% to 1500° C., and the PBN coating on this composite expanded 0.2% to 1500° C. Another composite not shown in FIG. 1 expanded about 0.16% on heating to 1500° C., and the PBN coating on it expanded 0.28% to 1500° C. In both cases, the PBN coatings would have a residual strain of about 0.1% at room temperature.

It was further discovered in accordance with the present invention that the as-deposited boron nitride coating can be rendered resistant to water without otherwise adversely affecting coating performance by the additional step of annealing the coatings at temperatures above 1750° C. to 2000° C. and preferably between about 1800° C. to 1900° C. to minimize dimensional changes caused by annealing. This additional step eliminates the susceptibility to water reaction. The following examples substantiate the resistance of the coating to moisture attack:

EXAMPLE 3

Two carbon-carbon composite bars, each about 75×25×2-3 mm, were mounted using a small hole near one end and a horizontal support rod, and then these bars were PBN coated using the pilot plant size CVD reactor of Examples 1 and 2. The samples were coated for 270 minutes at 1650° C. and 500 microns Hg, using an $NH_3:BCl_3$ molar ratio of 3.8, and then the coating was continued while the furnace was heated to 1900° C. in ten minutes and held at 1900° C. for another 25 minutes. Although the outer coating was more typical of high-temperature PBN deposits, the bulk of the deposit from Run 8904 was similar in structure to that of an unannealed 1650° C. deposit. The $FWHM_{002}$ was 67°, and the interlayer spacing $c_o/2$ was 3.42Å, which is typical of turbostratic PBN deposits. The $FWHM_{002}$ is the full width at half-maximum intensity of the x-ray(002) orientation distribution and is a measure of the preferred orientation of the crystallites in the PBN deposit as defined e.g. in A. W. Moore et al, *Journal of Applied Physics*, Vol. 65, p. 5109, 1989. A thermal expansion of 0.14-0.27% at 1500° C. was measured for this crack-free coating depending on substrate and location. More importantly, this heat-treated coating, unlike an unannealed 1650° C. PBN coating, was resistant to reaction with water at 95°-100° C.

EXAMPLE 4

Two carbon-carbon composite bars, mounted as described in Example 3, were coated at 1650° C. and 520 microns for 300 minutes, using an $NH_3: BCl_3$ molar ratio of 3.7. The PBN-coated composites were then heated to 2000° C. over a 30-minute period without further coating. The annealed coatings (Run 8906) were not only crack-free but also resistant to attack by 95°-100° C. water. One of the annealed coatings is illustrated as curve D in FIG. 2. Samples from this coating had a preferred orientation $FWHM_{002}$ of 61°-72° and an interlayer spacing of 3.41-3.43Å, typical of turbostratic PBN. The density measured ranged from 1.83-1.96 g/cc, and the percent expansion to 1500° C. was 0.20%, a very satisfactory value for compatibility with the low CTE carbon-carbon composites. Curve E is illustrative of the low CTE carbon-carbon composite thermal expansion.

Figure 2:
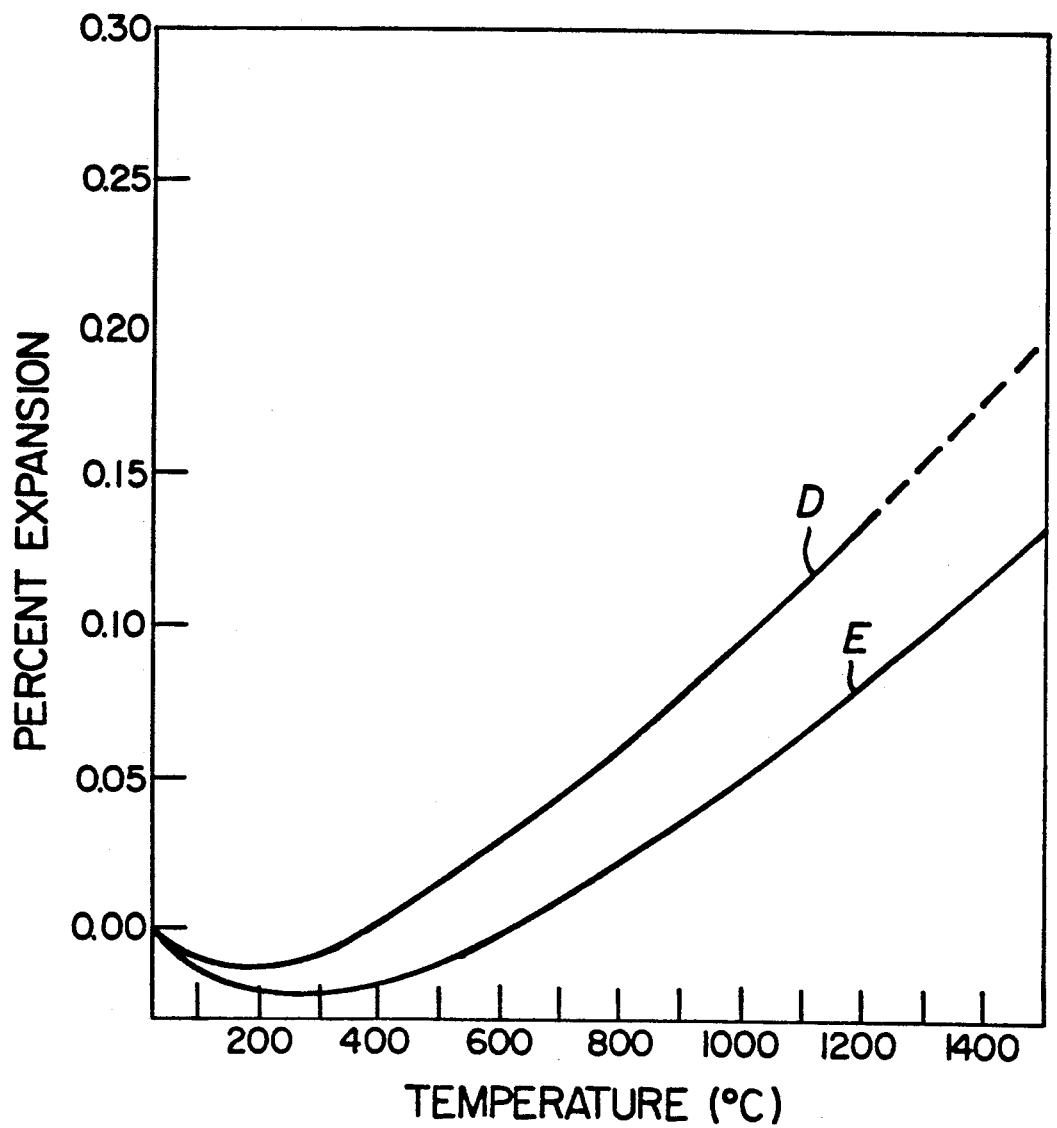
FIG. 2 shows the thermal expansion curve for a boron nitride coating deposited in accordance with a modified version of the process of the present invention for rendering the coating impervious to water.

FIG. 2 confirms that there is no adverse effect on the thermal expansion from the additional annealing step.

What is claimed is:

1. A process for producing a crack-free coating of pyrolytic boron nitride on a carbon-carbon composite structure comprising placing said carbon-carbon structure within a furnace chamber of a reactor vessel; heating the atmosphere in the furnace chamber to a uniform temperature of between 1500° C. and 1700° C.; introducing reactant vapors of ammonia and gaseous boron halide into said furnace chamber to deposit a coating of boron nitride on said carbon-carbon structure having a thermal expansion of between 0.14 to 0.32% over said temperature range; and maintaining such atmosphere with said temperature range throughout the deposition operation.

2. A process as defined in claim 1 wherein said temperature is maintained at about 1650° C.

3. A process as defined in claim 1 further comprising the step of annealing said coating of pyrolytic boron nitride at a temperature above 1750° C. to 2000° C.

4. A process as defined in claim 3 wherein said annealing temperature range lies between about 1800° C. to 1900° C.

5. A process for forming a well bonded coating of boron nitride upon a carbon or graphite structure having a thermal expansion to 1500° C. of below 0.32% comprising the steps of placing said carbon or graphite structure within a furnace chamber of a reactor vessel; heating the atmosphere in the furnace chamber to a uniform temperature of between 1500° C. and 1700° C.; introducing reactant vapors of ammonia nd gaseous boron halide into said furnace to deposit a coating of boron nitrite on said structure having a thermal expansion of between 0.14 to 0.32% over said temperature range; and adjusting the temperature of said atmosphere to a uniform temperature of below 1800° C. so as to match the thermal expansion of the as deposited boron nitride coating to the thermal expansion of said carbon or graphite structure within said temperature range thereby enhancing the bond between the boron nitride coating and said structure.

* * * * *